US010109654B2

(12) United States Patent
Choi

(10) Patent No.: US 10,109,654 B2
(45) Date of Patent: Oct. 23, 2018

(54) MANUFACTURING METHOD OF DISPLAY SUBSTRATE, DISPLAY SUBSTRATE AND DISPLAY DEVICE

(71) Applicant: BOE TECHNOLOGY GROUP CO., LTD., Beijing (CN)

(72) Inventor: Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/574,350

(22) PCT Filed: May 5, 2017

(86) PCT No.: PCT/CN2017/083125
§ 371 (c)(1),
(2) Date: Nov. 15, 2017

(87) PCT Pub. No.: WO2017/202188
PCT Pub. Date: Nov. 30, 2017

(65) Prior Publication Data
US 2018/0233515 A1 Aug. 16, 2018

(30) Foreign Application Priority Data
May 27, 2016 (CN) .......................... 2016 1 0366137

(51) Int. Cl.
H01L 21/84 (2006.01)
H01L 27/12 (2006.01)
(Continued)

(52) U.S. Cl.
CPC ...... H01L 27/124 (2013.01); H01L 21/31105 (2013.01); H01L 21/31144 (2013.01); H01L 21/3213 (2013.01); H01L 27/1259 (2013.01)

(58) Field of Classification Search
CPC ............... H01L 27/124; H01L 27/1259; H01L 21/31105; H01L 21/31144; H01L 21/3213
See application file for complete search history.

(56) References Cited

U.S. PATENT DOCUMENTS 9,423,659 B2 * 8/2016 Zhang ............... G02F 1/133707
2010/0289064 A1 * 11/2010 Or-Bach ........... H01L 21/26506
257/209
(Continued)

FOREIGN PATENT DOCUMENTS

CN 101009304 A 8/2007
CN 101893799 A 11/2010
(Continued)

OTHER PUBLICATIONS

International Search Report dated Aug. 25, 2017.

Primary Examiner — Richard Booth
(74) Attorney, Agent, or Firm — Dilworth & Barrese, LLP.; Michael J. Musella, Esq.

(57) ABSTRACT

A manufacturing method of a display substrate, a display substrate and a display device are provided. The manufacturing method of a display substrate including: forming a first metal pattern forming a first insulation layer; forming a second metal pattern; forming a second insulation layer forming a first conductive layer; patterning the first conductive layer to form a first conductive pattern; patterning the second insulation layer to form a second insulation pattern; wherein, an orthographic projection of the first conductive pattern on the base substrate and an orthographic projection of the second metal pattern on the base substrate have an overlapping part; and during patterning the second insulation layer, an orthographic projection of the first conductive pattern on the base substrate at least covers the overlapping part.

20 Claims, 9 Drawing Sheets

(51) Int. Cl.
*H01L 21/311* (2006.01)
*H01L 21/3213* (2006.01)

(56) References Cited

U.S. PATENT DOCUMENTS

2015/0200145 A1   7/2015   Yoo et al.
2015/0270164 A1   9/2015   Lin et al.

FOREIGN PATENT DOCUMENTS

CN      104952867 A      9/2015
CN      106128950 A      11/2016

* cited by examiner

MANUFACTURING METHOD OF DISPLAY SUBSTRATE, DISPLAY SUBSTRATE AND DISPLAY DEVICE

TECHNICAL FIELD

At least one embodiment of the present disclosure relates to a manufacturing method of a display substrate, a display substrate and a display device.

BACKGROUND

In conventional technology, a display substrate includes a plurality of insulation layers, and when an insulation layer pattern (via holes of an insulation layer) is formed, static electricity is easily generated, and the static electricity easily causes defects to the metal structure.

SUMMARY

At least one embodiment of the present disclosure relates to a manufacturing method of a display substrate, a display substrate and a display device, so as to avoid the occurrence of defects caused by electrostatic charges during a manufacturing process of a display substrate.

At least one embodiment of the present disclosure provide a manufacturing method of a display substrate, comprising: forming a first metal pattern on a base substrate; forming a first insulation layer on the first metal pattern; forming a second metal pattern on the first insulation layer; forming a second insulation layer on the second metal pattern; forming a first conductive layer on the second insulation layer; patterning the first conductive layer to form a first conductive pattern; after the first conductive pattern is formed, patterning the second insulation layer to form a second insulation pattern; wherein, an orthographic projection of the first conductive pattern on the base substrate and an orthographic projection of the second metal pattern on the base substrate have an overlapping part; and during patterning the second insulation layer, an orthographic projection of the first conductive pattern on the base substrate at least covers the overlapping part.

At least one embodiment of the present disclosure provides a display substrate manufactured by the manufacturing method according to at least one embodiment of the present disclosure.

At least one embodiment of the present disclosure provides a display device comprising the display substrate according to at least one embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
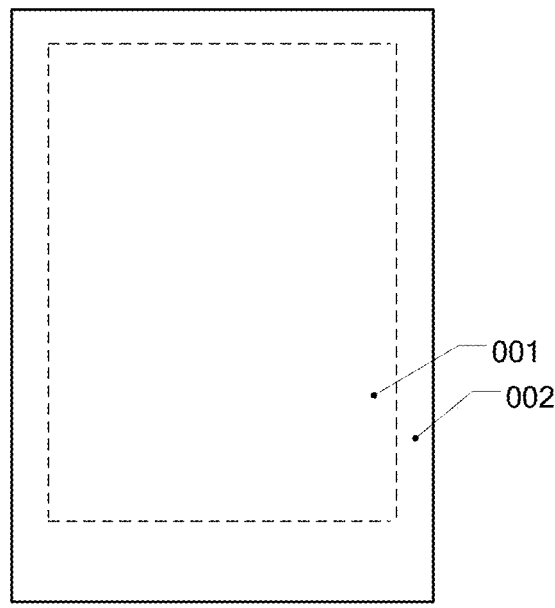
FIG. 1A is an area division of a display substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For example, a typical display substrate can include a plurality of metal layers formed on a base substrate, and metal patterns of the plurality of metal layers can have an overlapping area in a direction perpendicular to the base substrate. For example, static electricity, generated during a subsequent process of forming an insulation layer via hole, will affect the metal structure, for example, the overlapping area, and will break down the insulation layer between the two metal layers, especially the overlapping area in the metal layers, thereby causing defects. For example, the plurality of metal layers includes an SD layer and a gate layer. For example, the SD layer includes at least one of a data line, a source electrode and a drain electrode, or a metal structure formed in the same layer as at least one of the data line, the source electrode, and the drain electrode. For example, the gate layer includes at least one of a gate electrode and a gate line or a metal structure formed in the same layer as at least one of the gate electrode and the gate line, but is not limited thereto. The SD layer and the gate layer have the above-mentioned overlapping area, and thus defects due to static electricity are prone to occur.

At least one embodiment of the present disclosure provides a manufacturing method of a display substrate, including:

forming a first metal pattern on a base substrate;

forming a first insulation layer on the first metal pattern;

forming a second metal pattern on the first insulation layer;

forming a second insulation layer on the second metal pattern;

forming a first conductive layer on the second insulation layer;

patterning the first conductive layer to form a first conductive pattern;

after the first conductive pattern is formed, patterning the second insulation layer to form a second insulation pattern; wherein, an orthographic projection of the first conductive pattern on the base substrate and an orthographic projection of the second metal pattern on the base substrate have an overlapping part;

during patterning the second insulation layer, an orthographic projection of the first conductive pattern on the base substrate at least covers the overlapping part.

At least one embodiment of the present disclosure provides a manufacturing method of a display substrate, which can avoid the occurrence of defects caused by electrostatic charges during the manufacturing process of the display substrate.

As illustrated in FIG. 1A, the display substrate generally includes a display area 001 and a peripheral area 002 disposed on at least one side of the display area 001. FIG. 1A takes that the peripheral area 002 is disposed around the display area 001 as an example for description, but the present disclosure is not limited thereto. The manufacturing method in the embodiments is applicable to at least one of the display area 001 and the peripheral area 002. The effect is more obvious in a case that the manufacturing method is used in the peripheral area, because the wirings of the peripheral area are more intensive, static electricity is more prone to generate during manufacturing an insulation pattern (insulation via hole).

The following is a description of several specific embodiments.

First Embodiment

Figure 1B:
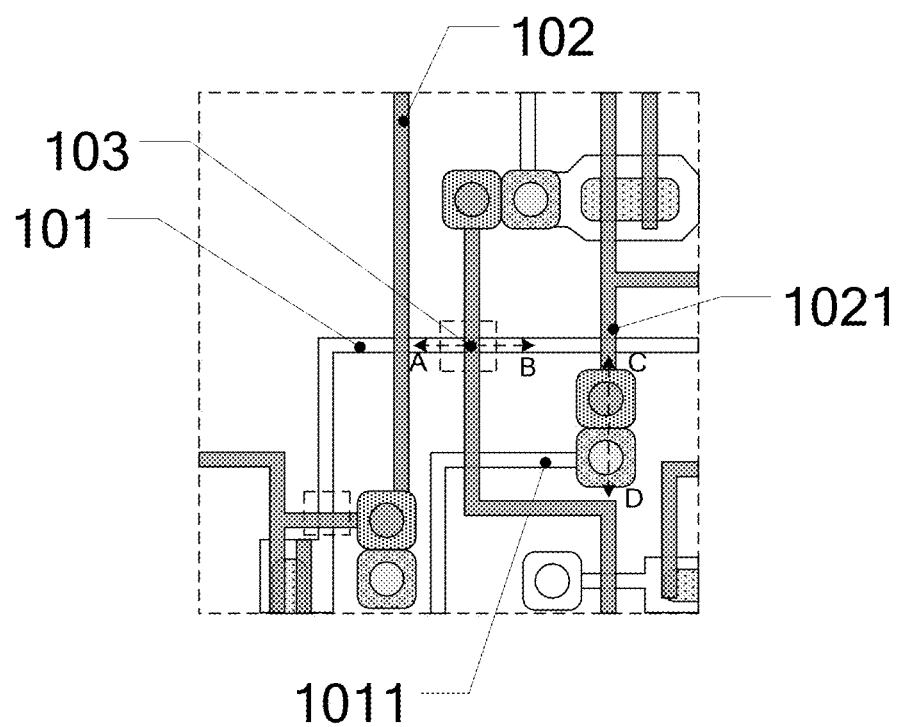
FIG. 1B is a partial schematic view illustrating a peripheral area of a display substrate.
Figure 2:
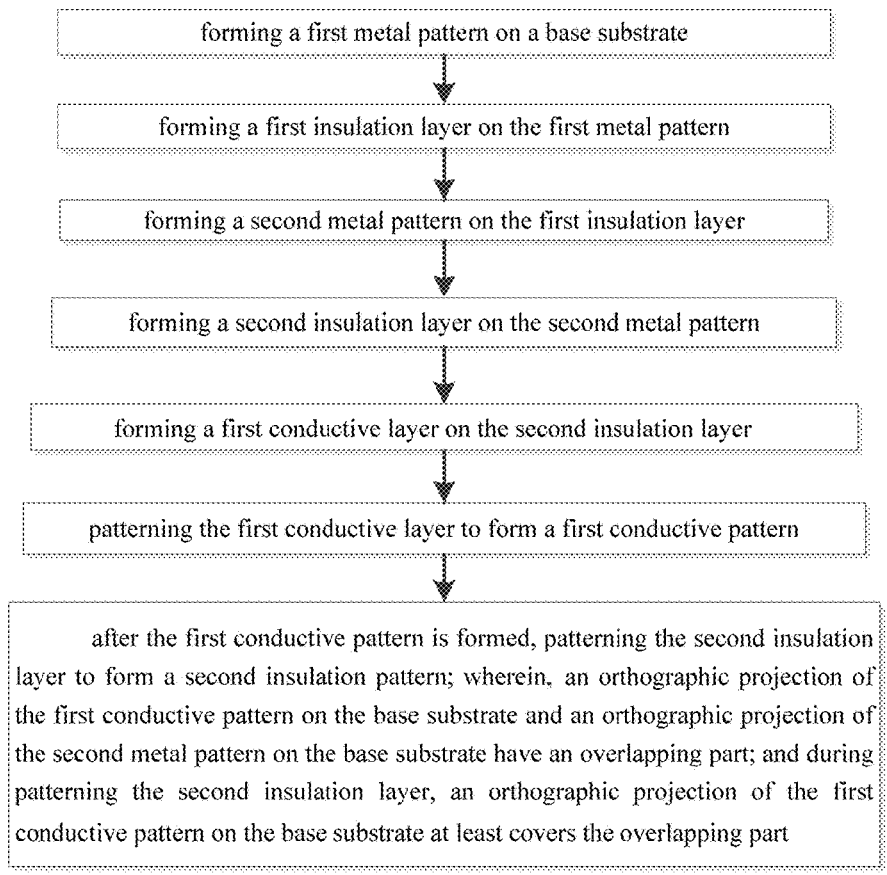
FIG. 2 is a flowchart of a manufacturing method of a display substrate according to the first embodiment of the present disclosure.

FIG. 1B illustrates a schematic plan view of a part of a peripheral area 002. In FIG. 1B, a first metal pattern 101 and a second metal pattern 102 are provided on the base substrate 100, and the first metal pattern 101 and the second metal pattern 102 are insulated from each other. For example, an insulation layer can be disposed between the first metal pattern 101 and the second metal pattern 102. An orthographic projection of the first metal pattern 101 on the base substrate 100 and the orthographic projection of the second metal pattern 102 on the base substrate 100 have an overlap portion 103. In a manufacturing method of a display substrate, defects are easily caused by the static electricity at the position of the overlapping part 103.

As illustrated in FIG. 2, FIG. 3A and FIG. 3D-3E, the present embodiment provides a manufacturing method of a display substrate, which includes the following steps.

Figure 3A:
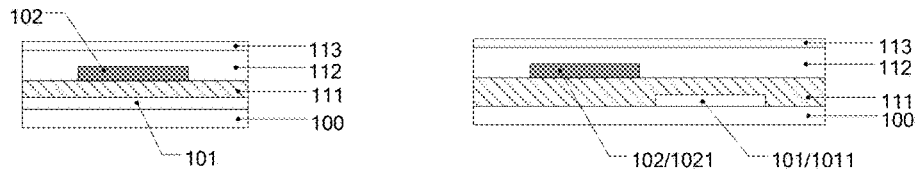
FIGS. 3A-3M are schematic views of a manufacturing method of a display substrate according to a first embodiment of the present disclosure, the left side diagram is a cross-sectional view taken along line A-B in FIG. 1B and the right side diagram is a cross-sectional view taken along line C-D in FIG. 1B.

As illustrated in FIG. 3A, a first metal pattern 101 is formed on a base substrate 100; a first insulation layer 111 is formed on the first metal pattern 101; a second metal pattern 102 is formed on the first insulation layer 111; a second insulation layer 112 is formed on the metal pattern 102, and a first conductive layer 113 is formed on the second insulation layer 112.

Figure 3B:
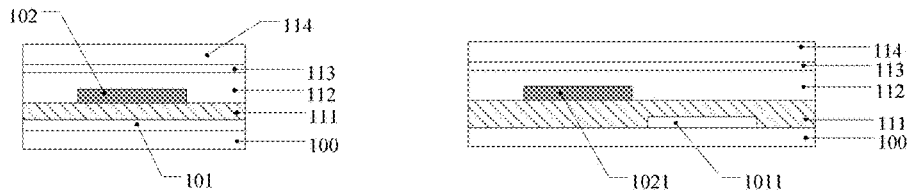
Figure 3C:
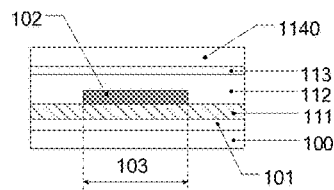
Figure 3C:
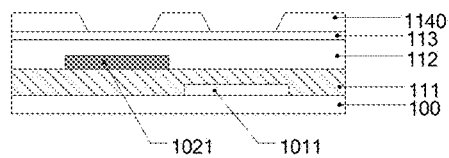
Figure 3D:
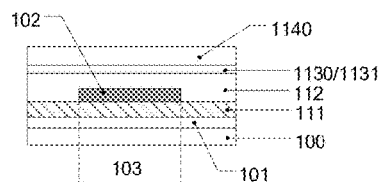
Figure 3D:
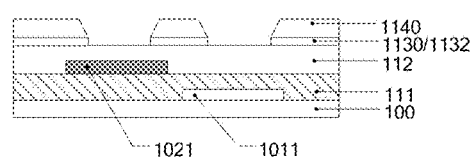

As illustrated in FIG. 3D, the first conductive layer 113 is patterned to form a first conductive pattern 1130.

Figure 3E:
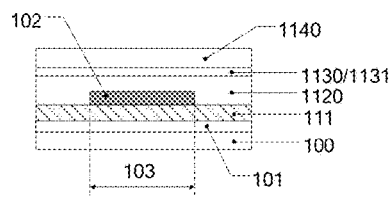
Figure 3E:
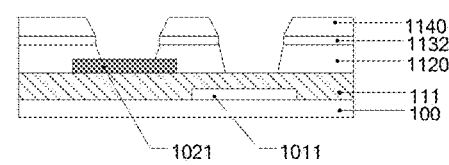

As illustrated in FIG. 3E, the second insulation layer 112 is patterned to form a second insulation pattern 1120.

As illustrated in FIG. 3E, an orthographic projection of the first metal pattern 101 on the base substrate 100 and an orthographic projection of the second metal pattern 102 on the base substrate 100 have an overlapping part 103.

During patterning the second insulation layer 112, an orthographic projection of the first conductive pattern 1130 on the base substrate 100 covers at least the overlapping part 103.

Because the orthographic projection of the first conductive pattern 1130 on the base substrate 100 covers at least the overlapping part 103 in the process of patterning the second insulation layer 112, the first conductive pattern 1130 can disperse electrostatic charges generated in the process of patterning the second insulation layer 112, thereby avoiding defects caused by the electrostatic charges.

Figure 3F:
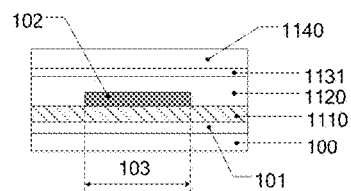
Figure 3F:
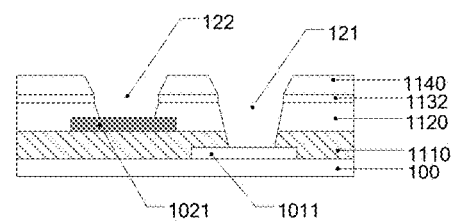

As illustrated in FIG. 3F, in some examples, the manufacturing method further includes patterning the first insulation layer 111 to form a first insulation pattern 1110. During patterning the first insulation layer 111, the orthographic projection of the first conductive pattern 1130 on the base substrate 100 at least covers the overlapping part 103. Similarly, because the overlapping part 103 is covered by the first conductive pattern 1130 in the process of forming the first insulation pattern 1110, the electrostatic charges generated during patterning the first insulation layer 111 can be dispersed, thereby avoiding defects caused by electrostatic charges.

As illustrated in FIGS. 1B and 3F, in some examples, the first metal pattern 101 further includes a first end 1011 and the second metal pattern 102 further includes a second end 1021. The first conductive pattern 1130 includes a first covering portion 1131 and a first conductive portion 1132 which are independent from each other. An orthographic projection of the first covering portion 1131 on the base substrate 100 covers at least the overlapping part 103. The first conductive pattern 1130, the second insulation pattern 1120, and the first insulation pattern 1110 include a first via hole 121 running through the first conductive layer 113, the second insulation layer 112 and the first insulation layer 111 and exposing the first end 1011 and a second via hole 122 running through the first conductive layer 113 and the second insulation layer 112 and exposing the second end 1021. For example, the first covering portion 1131 and the first conductive portion 1132 which are independent from each other means that the first covering portion 1131 and the first conductive portion 1132 are not electrically connected with each other and are insulated from each other.

As illustrated in FIGS. 3B-3D, in some examples, patterning the first conductive layer 113 to form the first conductive pattern 1130 includes the following steps.

As illustrated in FIG. 3B, a first photoresist layer 114 is formed on the first conductive layer 113.

As illustrated in FIG. 3C, the first photoresist layer 114 is exposed and developed to form a first photoresist pattern 1140, a removed region of the first photoresist pattern 1140 includes a region corresponding to the first via hole 121 and the second via hole 122.

As illustrated in FIG. 3D, the first conductive layer 113 is etched with the first photoresist pattern 1140 as a mask to form a first conductive pattern 1130.

As illustrated in FIGS. 3E-3F, in some examples, patterning the second insulation layer 112 to form the second insulation pattern 1120 and patterning the first insulation layer 111 to form the first insulation pattern 1110 include the following steps.

As illustrated in FIG. 3E, the second insulation layer 112 is etched with the first photoresist pattern 1140 as a mask to form a second insulation pattern 1120.

As illustrated in FIG. 3F, the first insulation layer 111 is etched with the first photoresist pattern 1140 as a mask to form a first insulation pattern 1110.

Figure 3G:
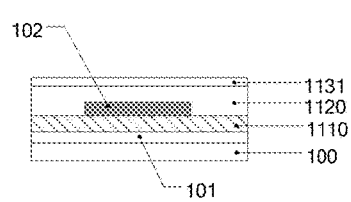
Figure 3G:
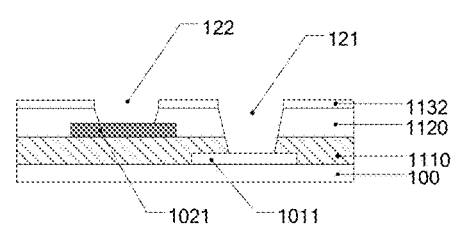

In some examples, after the first insulation pattern 1110 is formed, the manufacturing method further includes removing the first photoresist pattern 1140 to form a structure as illustrated in FIG. 3G.

Figure 3H:
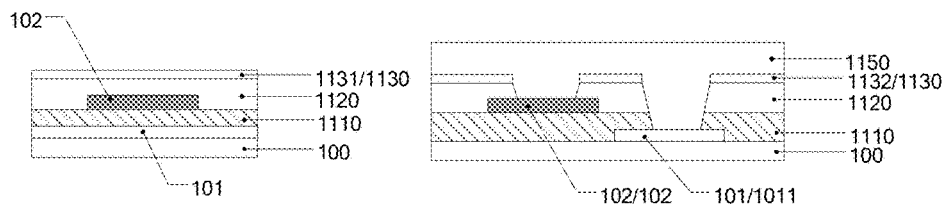
Figure 3I:
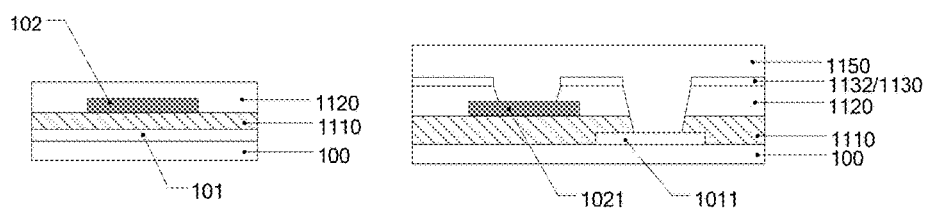

As illustrated in FIGS. 3H-3I, in some examples, after the first photoresist pattern 1140 is removed, the manufacturing method further includes forming a second photoresist pattern 1150 (as illustrated in FIG. 3H) and patterning the first conductive pattern 1130 with the second photoresist pattern 1150 as a mask to remove the first covering portion 1131 of the first conductive pattern 1130 and retain the first conductive portion 1132 of the first conductive pattern 1130 (as illustrated in FIG. 3I). For example, forming the second photoresist pattern 1150 includes forming a second photoresist layer (forming a second photoresist layer on the structure as illustrated in FIG. 3G), exposing and developing the second photoresist layer to form a second photoresist pattern 1150.

Figure 3J:
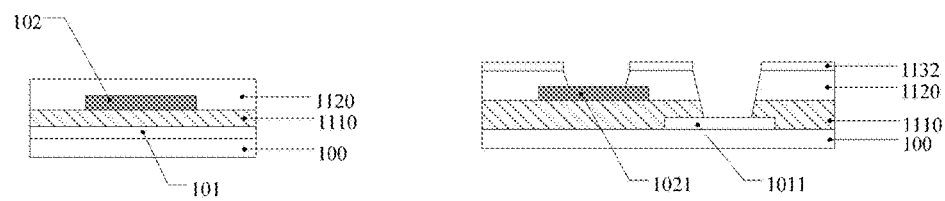

As illustrated in FIG. 3J, in some examples, the manufacturing method further includes removing the second photoresist pattern 1150.

Figure 3K:
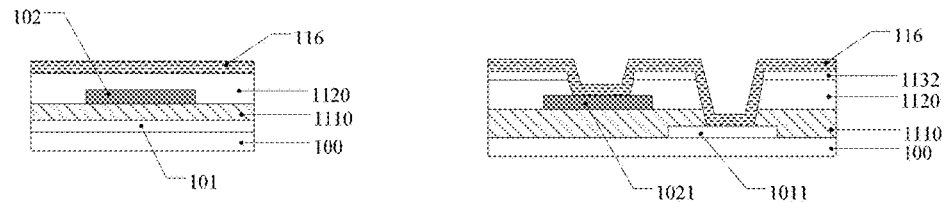
Figure 3L:
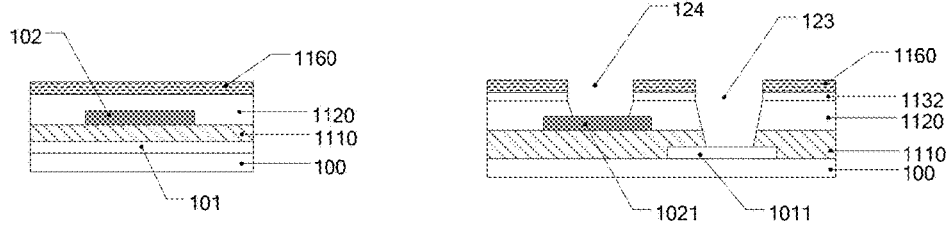

As illustrated in FIGS. 3K-3L, in some examples, after the second insulation pattern 1120 and the first insulation pattern 1110 are formed, the manufacturing method further includes forming a third insulation layer 116 (as illustrated in FIG. 3K) and patterning the third insulation layer 116 to form a third insulation pattern 1160 (as illustrated in FIG. 3L). The third insulation pattern 1160, the first conductive pattern 1130, the second insulation pattern 1120, and the first insulation pattern 1110 include: a third via hole 123 running through the third insulation layer 116, the first conductive layer 113, the second insulation layer 112, and the first insulation layer 111 at a position corresponding to the first via hole 121 and exposing the first end 1011 and a fourth via hole 124 running through the third insulation layer 116, the first conductive layer 113 and the second insulation layer 112 at a position corresponding to the second via hole 122 and exposing the second end 1021.

Figure 3M:
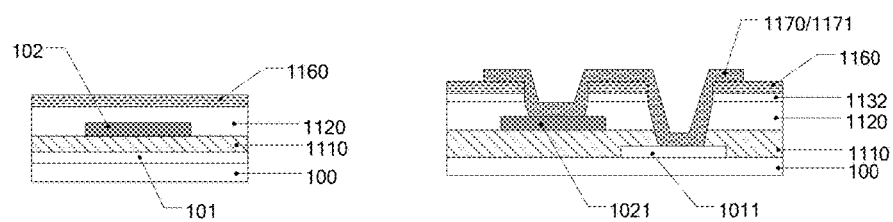

As illustrated in FIG. 3M, in some examples, after the third insulation pattern 1160 is formed, the manufacturing method further includes forming a second conductive pattern 1170, the second conductive pattern 1170 includes a first connection structure 1171, and the first connection structure 1171 electrically connects the first end 1011 with the second end 1021 via the third via hole 123 and the fourth via hole 124. For example, forming the second conductive pattern 1170 includes: forming a second conductive layer (a second conductive layer is formed on the basis of the structure as illustrated in FIG. 3L), forming a third photoresist layer on the second conductive layer, exposing and developing the third photoresist layer to form a third photoresist pattern, and etching the second conductive layer with the third photoresist pattern as a mask to form a second conductive pattern.

As illustrated in FIG. 3M, in some examples, the first connection structure 1171 electrically connects parts of the first conductive portion 1132 which are disconnected at positions of the third via hole 123 and the fourth via hole 124. Therefore, the parts of the first conductive portion 1132 electrically connect with the first end 1011 and the second end 1021 via the first connection structure 1171 located at the third via hole 123 and the fourth via hole 124, thereby increasing stability of the electrical connection of the first end 1011 and the second end 1021.

In some examples, a material of the first conductive pattern 1130 includes at least one selected from a group consisting of transparent conductive metal oxide and metal. The transparent conductive metal oxide includes, for example, indium tin oxide (ITO), but is not limited thereto.

In some examples, a material of the second conductive pattern 1170 includes a transparent conductive metal oxide, but is not limited thereto.

In some examples, a material of at least one of the first insulation layer 111, the second insulation layer 112 and the third insulation layer 116 includes silicon nitride (SiNx), silicon oxide (SiOx), silicon nitrogen oxide (SiNxOy), aluminum oxide, but is not limited thereto.

In some examples, the first metal pattern 101 can be formed by forming a first metal layer and patterning the first metal layer, the second metal pattern 102 can be formed by forming a second metal layer and patterning the second metal layer, which are not limited to this. For example, the first metal pattern 101 and the second metal pattern 102 include a single layer formed by any one of molybdenum (Mo), molybdenum-niobium alloy, aluminum (Al), aluminum neodymium alloy (AlNd), titanium (Ti) and copper or a laminated structure obtained by forming sub-layers using molybdenum/aluminum/molybdenum (Mo/Al/Mo), titanium/aluminum titanium (Ti/Al/Ti), which are not limited thereto.

In the embodiments of the present disclosure, patterning or patterning process can only include a photolithographic process or include a photolithographic process and an etching process, or can include other processes for forming a predetermined pattern, such as printing, ink-jetting, and the like. The photolithographic process refers to processes of film forming, exposing, developing and the like to form a pattern by using photoresist, mask, exposure machine and the like. The corresponding patterning process can be selected according to the structure formed in the embodiments of the present disclosure.

Second Embodiment

Figure 4A:
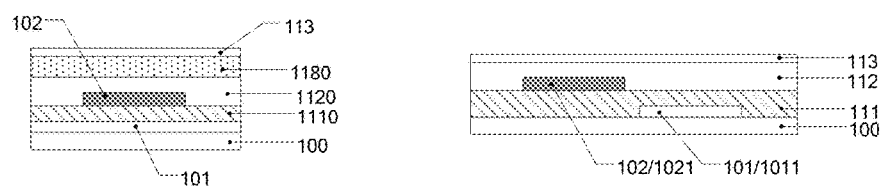
FIGS. 4A, 4B and 4C are schematic diagrams of partial steps of a manufacturing method of a display substrate including a fourth insulation pattern according to a second embodiment of the present disclosure.

The manufacturing method of a display substrate provided in this embodiment is different from that of the first embodiment in that: as illustrated in FIG. 4A, the manufacturing method further includes forming a fourth insulation pattern 1180 on the second insulation layer 112, a material of the fourth insulation pattern 1180 includes resin, for further example, includes an acrylic resin or a polyimide resin, but is not limited thereto.

For example, forming the fourth insulation pattern 1180 includes: forming a fourth insulation layer, forming a fourth photoresist layer on the fourth insulation layer, exposing and developing the fourth photoresist layer to form a fourth photoresist pattern, etching the fourth insulation layer with the fourth photoresist pattern as a mask to form a fourth insulation pattern 1180.

Figure 4B:
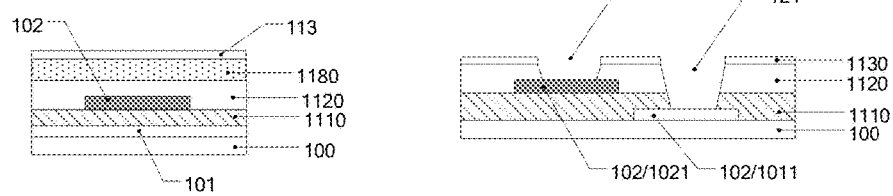
Figure 4C:
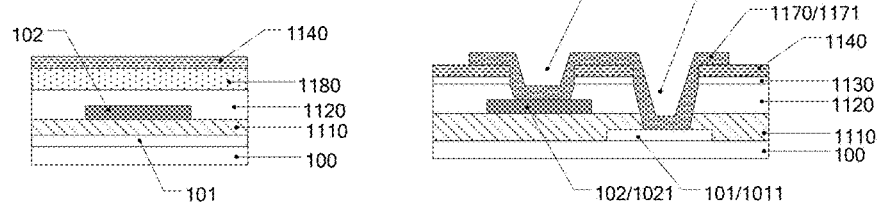

FIG. 4B illustrates forming the first via hole 121 and the second via hole 122. FIG. 4C illustrates the formed third insulation pattern and the first connection structure 1171. FIG. 4A of the embodiment can correspond to the step of FIG. 3A, FIG. 4B can correspond to the step of FIG. 3G, and FIG. 4C can correspond to the step of FIG. 3M, except that the fourth insulation pattern 1180 is further provided, details can refer to FIG. 3A-3M.

For the rest, reference can be made to the first embodiment, and repeated portions will be omitted here.

Third Embodiment

Figure 5:
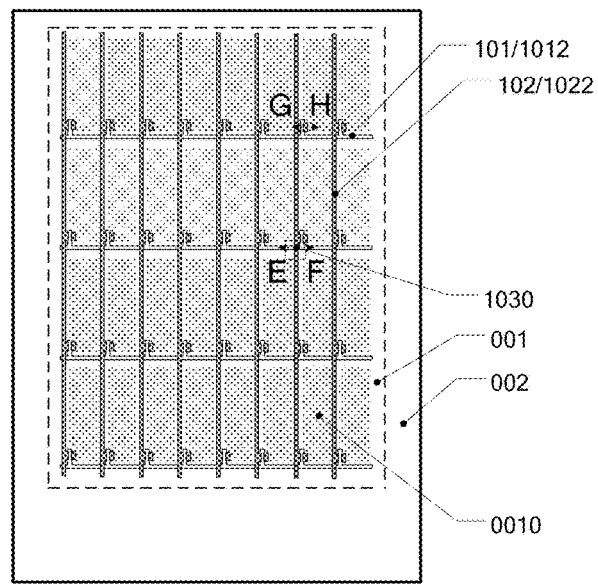
FIG. 5 is a schematic view of a display substrate and a display area of the display substrate.

In the manufacturing method of a display substrate provided in this embodiment, the manufacturing method is adopted only in the display area. In this case, the material of the first conductive pattern 1130 can be transparent conductive metal oxide, which is not limited thereto. FIG. 5 illustrates a schematic structural view of the display substrate and the display area.

As illustrated in FIGS. 5, 6A-6L, the manufacturing method of the display substrate provided in this embodiment includes the following steps.

Figure 6A:
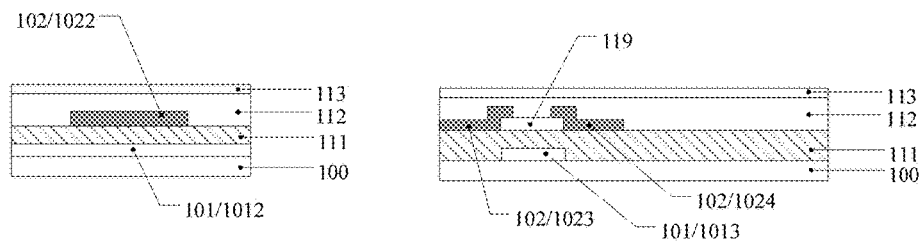
FIGS. 6A-6L are schematic views of a manufacturing method of the display substrate according to a third embodiment of the present disclosure, the left side diagram is a cross-sectional view taken along line E-F in FIG. 5 and the right side diagram is a cross-sectional view taken along line G-H in FIG. 5.

As illustrated in FIG. 6A, a first metal pattern 101 is formed on a base substrate 100; a first insulation layer 111 is formed on the first metal pattern 101; a second metal pattern 102 is formed on the first insulation layer 111; a second insulation layer 112 is formed on the second metal pattern 102, a first conductive layer 113 is formed on the second insulation layer 112. In some examples, the first metal pattern 101 includes a gate electrode 1013, the second metal pattern 102 includes a source electrode 1023 and a drain electrode 1024, and an active layer 119 is further formed between the first insulation layer 111 and the second metal pattern 102 at a position corresponding to the gate electrode 1013.

Figure 6B:
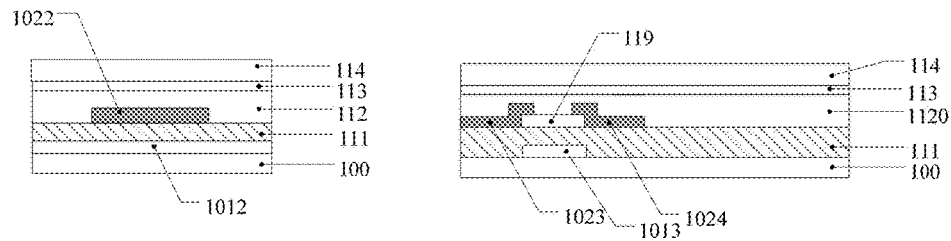
Figure 6C:
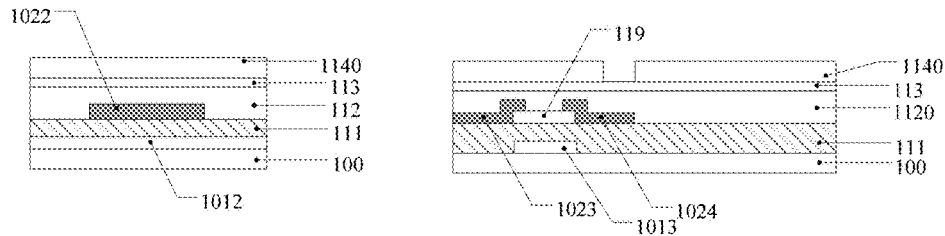
Figure 6D:
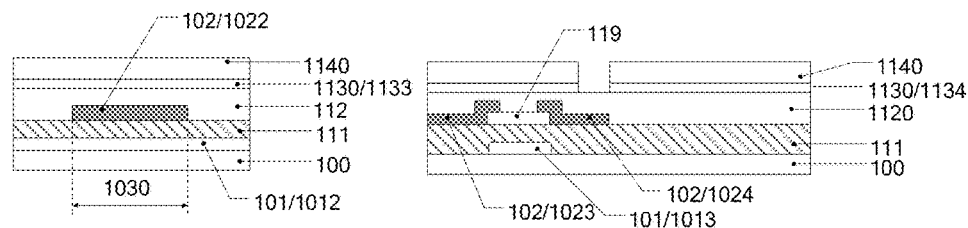

As illustrated in FIG. 6D, the first conductive layer 113 is patterned to form a first conductive pattern 1130.

Figure 6E:
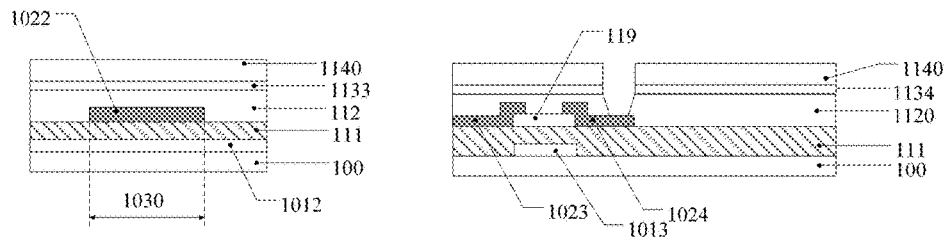

As illustrated in FIG. 6E, the second insulation layer 112 is patterned to form a second insulation pattern 1120.

As illustrated in FIG. 5 and FIG. 6E, an orthographic projection of the first metal pattern 101 on the base substrate 100 and an orthographic projection of the second metal pattern 102 on the base substrate 100 have an overlapping portion 1030.

As illustrated in FIGS. 6D and 6E, during patterning the second insulation layer 112, an orthographic projection of the first conductive pattern 1130 on the base substrate 100 covers at least the overlapping part 103.

In the process of patterning the second insulation layer 112, the orthographic projection of the first conductive pattern 1130 on the base substrate 100 at least covers the overlapping part 1030, thus the first conductive pattern 1130 can disperse electrostatic charges generated in the patterning process of the second insulation layer 112, thereby avoiding defects caused by the electrostatic charges.

In some examples, as illustrated in FIG. 5, the first metal pattern 101, the second metal pattern 102, the first conductive pattern 1130, and the second conductive pattern 1170 are located in the display area 001. The display area 001 includes a gate line 1012 and a data line 1022. One of the first metal pattern 101 and the second metal pattern 102 includes the gate line 1012 and the other includes the data line 1022. An orthographic projection of the gate line 1012 on the base substrate 100 and an orthographic projection of the data line 1022 on the base substrate 100 have an overlapping part 1030. For example, as illustrated in FIG. 5, the plurality of gate lines 1012 are parallel with each other, and the plurality of data lines 1022 are parallel with each other. The plurality of gate lines 1012 and the plurality of data lines 1022 are intersected with each other and are insulated from each other to define a plurality of sub-pixels 0010. It should be noted that this is only an example, and the display area can be other structures.

According to the position of the gate electrode relative to the active layer, the thin film transistors can be divided into a top-gate structure and a bottom-gate structure. According to the positions of the source/drain electrodes relative to the active layer, the thin film transistors can be divided into a top-contact structure and a bottom-contact structure. It should be noted that the embodiment of the present disclosure is described by taking a thin film transistor with a bottom-gate structure as an example, but a top-gate thin film transistor can also be used. The embodiment of the present disclosure is described by taking a thin film transistor with a top-contact structure as an example, However, a bottom-contact thin film transistor can also be used, which is not limited by the embodiment of the present disclosure.

In some examples, as illustrated in FIGS. 6D and 6E, the first conductive pattern 1130 in the display area includes a second covering portion 1133 and a second conductive portion 1134. During patterning the second insulation layer 112, an orthographic projection of the second covering portion 1133 on the base substrate 100 at least covers the overlapping portion 1030. During patterning the second insulation layer 112, an orthographic projection of the second covering portion 1133 on the base substrate 100 at least covers the overlapping part 1030.

Figure 6F:
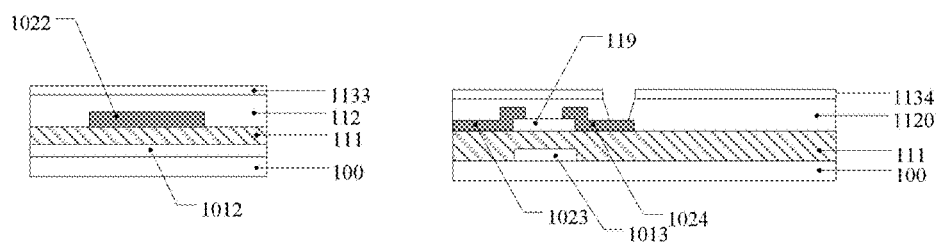
Figure 6G:
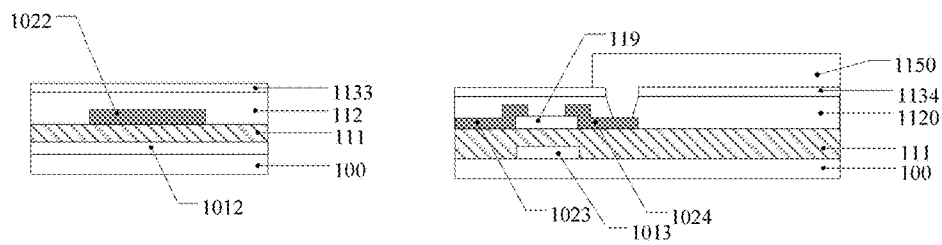
Figure 6H:
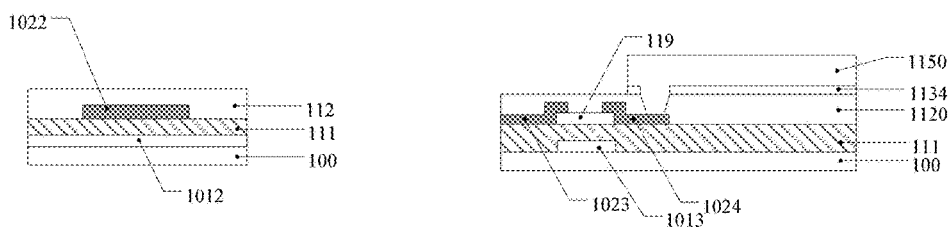
Figure 6I:
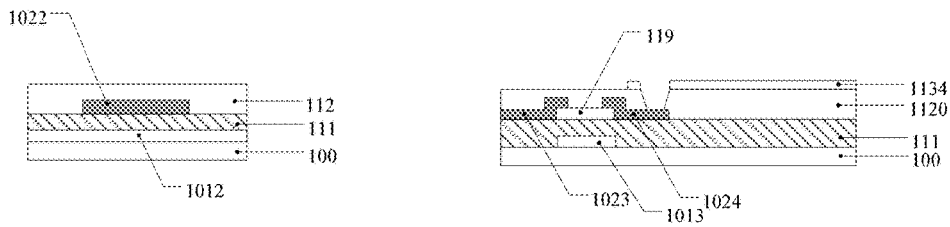
Figure 6J:
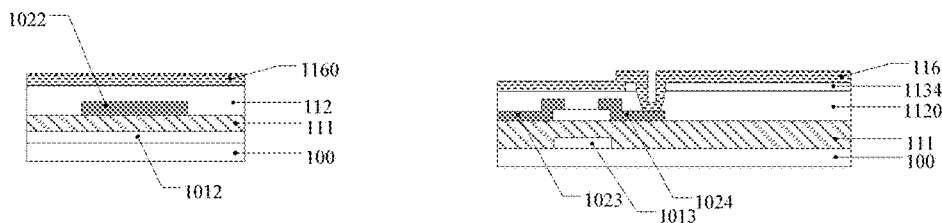
Figure 6K:
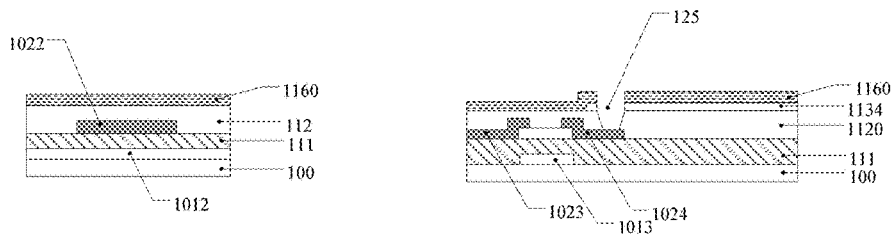
Figure 6L:
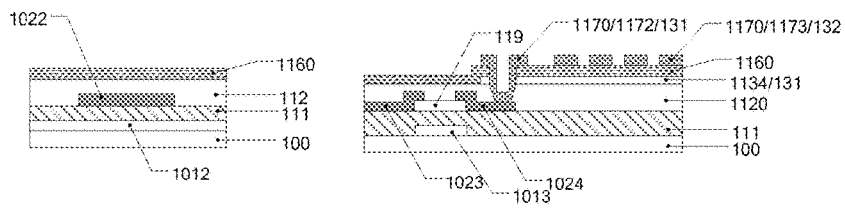

As illustrated in FIGS. 6J-6L, in some examples, after the second insulation pattern 1120 is formed, the manufacturing method further includes forming a third insulation layer 116 and patterning the third insulation layer 116 to form a third insulation pattern 1160, One of the first metal pattern 101 and the second metal pattern 102 further includes a drain electrode 1024, and at least two of the first insulation layer 111, the second insulation layer 112 and the third insulation layer 116 include a fifth via hole 125 at a position corresponding to the drain electrode 1024 and exposing the drain electrode 1024.

As illustrated in FIG. 6L, in some examples, after the third insulation pattern 1160 is formed, the manufacturing method further includes forming a second conductive pattern 1170, and the second conductive pattern 1170 includes a second connection structure 1172 and a second electrode 1173. The second connection structure 1172 electrically connects the drain electrode 1024 with the first electrode 1134 via the fifth via hole 125 to form a structure in which the pixel electrode 131 is electrically connected with the drain electrode 1024, and the second electrode 1173 is a common electrode 132. The portion of the second conductive pattern in FIG. 6L excluding the second connection structure 1172 is the common electrode 132.

It should be noted that the number of insulation layers which the fifth via hole runs through depends on the number of insulation layers disposed between the pixel electrode and the drain electrode. In the present disclosure, the number of the insulation layers to be provided is not limited, and the number of the insulation layers can be determined according to requirements.

As illustrated in FIGS. 6B-6D, in some examples, patterning the first conductive layer 113 to form the first conductive pattern 1130 includes following steps.

As illustrated in FIG. 6B, a first photoresist layer 114 is formed on the first conductive layer 113.

As illustrated in FIG. 6C, the first photoresist layer 114 is exposed and developed to form a first photoresist pattern 1140, and a removed region of the first photoresist pattern 1140 includes a region corresponding to the fifth via hole 121.

As illustrated in FIG. 6D, the first conductive layer 113 is etched with the first photoresist pattern 1140 as a mask to form a first conductive pattern 1130.

As illustrated in FIG. 6E, in some examples, patterning the second insulation layer 112 to form the second insulation pattern 1120 includes: etching the second insulation layer 112 with the first photoresist pattern 1140 as a mask to form a second insulation pattern 1120.

In some examples, the manufacturing method further includes removing the first photoresist pattern 1140 to form a structure as illustrated in FIG. 6F.

As illustrated in FIGS. 6G-6H, in some examples, after the first photoresist pattern 1140 is removed, the manufacturing method further include forming a second photoresist pattern 1150 and patterning the first conductive pattern 1130 with the second photoresist pattern 1150 as a mask to remove the second covering portion 1133 of the first conductive pattern 1130 and retain the second conductive portion 1134 of the first conductive pattern 1130. For example, forming the second photoresist pattern 1150 includes forming a second photoresist layer (forming a second photoresist layer on the structure as illustrated in FIG. 6F), exposing and developing the second photoresist layer to form a second photoresist pattern 1150.

As illustrated in FIG. 6I, in some examples, the manufacturing method further include removing the second photoresist pattern 1150.

With regard to the material of the first conductive pattern 1130, the second conductive pattern 1170, the first metal pattern 101, and the second metal pattern 102, reference can be made to the first embodiment, and the redundant portions will be omitted here.

In some examples, a material of the active layer 119 of the thin film transistor includes amorphous silicon, poly-silicon, oxide semiconductor, and the like. For further example, oxide semiconductor includes indium gallium zinc oxide (IGZO) and indium zinc oxide (IZO), but is not limited thereto. For example, in a case that the oxide semiconductor is used as the active layer, an etching stop layer can be disposed between the active layer and the layer where the source/drain electrode is located, so as to avoid the influence of the etching solution on the active layer during a wet etching of the source/drain electrode. The embodiments of the present disclosure are not limited thereto. The material of the active layer 119 is not limited in the embodiments of the present disclosure.

Fourth Embodiment

Figure 7:
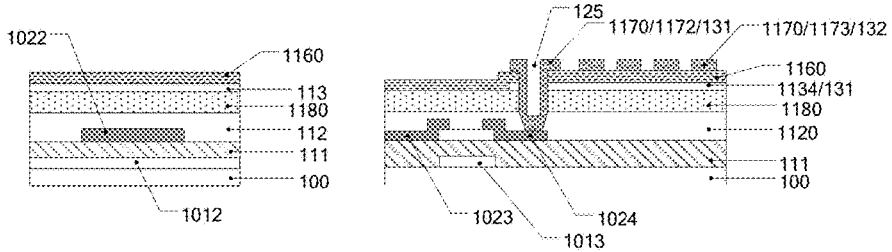
FIG. 7 is a display substrate provided with a fourth insulation layer formed by a manufacturing method provided by a fourth embodiment of the present disclosure.

As illustrated in FIG. 7, the difference between this embodiment and the third embodiment is in that: the display substrate includes a fourth insulation pattern 1180, and the fourth insulation pattern 1180 includes a fifth via hole 125 running through the fourth insulation layer.

Fifth Embodiment

On the basis of the first embodiment and/or the second embodiment, the manufacturing method of the present disclosure is used in both the display area 001 and the peripheral area in the present embodiment, and the first conductive pattern is employed to disperse the electrostatic charges generated in the manufacturing process.

For example, the first metal pattern 101, the second metal pattern 102, the first conductive pattern 1130, and the second conductive pattern 1170 described in the first embodiment and/or the second embodiment are located in the peripheral area 002, which is combined with the third embodiment or the fourth embodiment to obtain the content of this embodiment. As illustrated in FIGS. 6A-6L, the display area includes a plurality of gate lines 1012, a plurality of data lines 1022, a gate electrode 1013, a source electrode 1023 and a drain electrode 1024.

For example, the gate electrode 1013 is formed in the same layer as one of the first metal pattern 101 and the second metal pattern 102, the drain electrode 1024 is formed in the same layer as the other of the first metal pattern 101 and the second metal pattern 102, and the first electrode 1134 and the first conductive pattern 1130 are formed in the same layer, and the second electrode 1173 and the second conductive pattern 1170 are formed in the same layer.

It should be noted that in this embodiment, for example, the steps in FIG. 6A-6E correspond to the steps in FIGS. 3A-3E respectively; the steps in FIG. 6F-6L correspond to the steps in FIG. 3G-3M respectively. That is, FIG. 6A corresponds to FIG. 3A, FIG. 6B corresponds to FIG. 3B, and so on. Although the former formation steps are slightly different (the active layer 119 of the thin film transistor is formed in FIG. 6A), the later steps corresponded to each other except that the first insulation layer does not need to be patterned in the display area (the first insulation layer is patterned only in the peripheral area). Specific steps can be referred to FIGS. 3A-3M and FIGS. 6A-6L.

It should be noted that, in this embodiment, the second covering portion 1133 may not be provided, as long as the overlapping part of the peripheral area is covered with the first conductive pattern.

Sixth Embodiment

The difference between the present embodiment and the fifth embodiment is in that: the pattern structures of the first conductive pattern and the second conductive pattern in the display area are adjusted, and a fourth insulation pattern 1180 is provided. Regarding the fourth insulation pattern 1180, reference can be made to the foregoing description.

Figure 8:
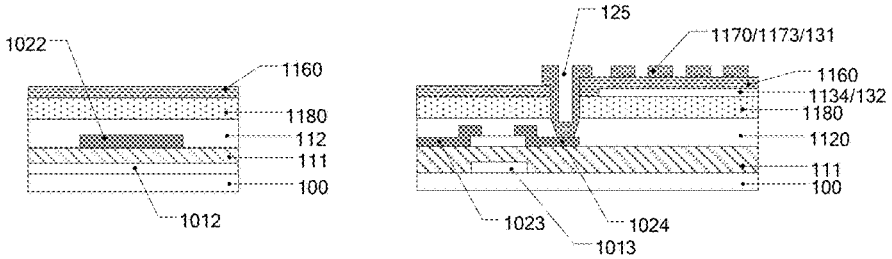
FIG. 8 illustrates another display substrate formed by a manufacturing method provided by a sixth embodiment of the present disclosure.

As illustrated in FIG. 8, in some examples, the first electrode 1134 is a common electrode 132 and the second electrode 1173 is a pixel electrode 131.

Seventh Embodiment

The display substrate provided in this embodiment is formed by any of the manufacturing methods described in the first embodiment to the sixth embodiment. For example, the display substrate can be an array substrate.

Eighth Embodiment

The display device provided in this embodiment includes any one of the display substrates described in the seventh embodiment.

For example, the display device can be a display device such as a liquid crystal display, an electronic paper, or an OLED (Organic Light-Emitting Diode) display, and a television, a digital camera, a cell phone, a watch, a tablet, a notebook, and a navigation device including these display device and any other display products or components.

The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness of a layer or a region may be enlarged. However, it should understood that, in the case in which a component or element such as a layer, film, area, substrate or the like is referred to be "on" or "under" another component or element, it may be directly on or under the another component or element or a component or element is interposed there between.

(4) In case of no conflict, features in different embodiments or in one embodiment can be combined.

What are described above is the embodiments of the disclosure only and not limitative to the scope of the disclosure; any of those skilled in related arts can easily conceive variations and substitutions in the technical scopes disclosed by the disclosure, which are encompassed in protection scopes of the disclosure. Therefore, the scopes of the disclosure should be defined in the appended claims.

The application claims priority to the Chinese patent application No. 201610366137.8, filed May 27, 2016, the entire disclosure of which is incorporated herein by reference as part of the present application.

The invention claimed is:

1. A manufacturing method of a display substrate, comprising:
    forming a first metal pattern on a base substrate;
    forming a first insulation layer on the first metal pattern;
    forming a second metal pattern on the first insulation layer;
    forming a second insulation layer on the second metal pattern;
    forming a first conductive layer on the second insulation layer;
    patterning the first conductive layer to form a first conductive pattern;
    after the first conductive pattern is formed, patterning the second insulation layer to form a second insulation pattern; wherein,
    an orthographic projection of the first conductive pattern on the base substrate and an orthographic projection of the second metal pattern on the base substrate have an overlapping part; and
    during patterning the second insulation layer, an orthographic projection of the first conductive pattern on the base substrate at least covers the overlapping part.

2. The manufacturing method of the display substrate according to claim 1, further comprising patterning the first insulation layer to form a first insulation pattern, wherein, during patterning the first insulation layer, an orthographic projection of the first conductive pattern on the base substrate at least covers the overlapping part.

3. The manufacturing method of the display substrate according to claim 2, wherein, the first metal pattern further comprises a first end, the second metal pattern further comprises a second end, the first conductive pattern comprises a first covering portion and a first conductive portion which are independent from each other, an orthographic projection of the first covering portion on the base substrate at least covers the overlapping part; the first conductive pattern, the second insulation pattern and the first insulation pattern comprise: a first via hole running through the first conductive layer, the second insulation layer and the first insulation layer and exposing the first end, and a second via hole running though the first conductive layer and the second insulation layer and exposing the second end.

4. The manufacturing method of the display substrate according to claim 3, wherein, patterning the first conductive layer to form the first conductive pattern comprises:
    forming a first photoresist layer on the first conductive layer;
    exposing and developing the first photoresist layer to form a first photoresist pattern, a removed region of the first photoresist pattern comprising a region corresponding to a position of the first via hole and the second via hole; and
    etching the first conductive layer with the first photoresist pattern as a mask to form the first conductive pattern.

5. The manufacturing method of the display substrate according to claim 4, wherein, patterning the second insulation layer to form the second insulation pattern and patterning the first insulation layer to form the first insulation pattern comprise:
    etching the second insulation layer with the first photoresist pattern as a mask to form the second insulation pattern;
    etching the first insulation layer with the first photoresist pattern as a mask to form the first insulation pattern.

6. The manufacturing method of the display substrate according to claim 5, after the first insulation pattern is formed, further comprising removing the first photoresist pattern.

7. The manufacturing method of the display substrate according to claim 6, after the first photoresist pattern is removed, further comprising forming a second photoresist pattern and patterning the first conductive pattern with the second photoresist pattern as a mask, so as to remove the first covering portion of the first conductive pattern and retain the first conductive portion of the first conductive pattern.

8. The manufacturing method of the display substrate according to claim 7, further comprising removing the second photoresist pattern.

9. The manufacturing method of the display substrate according to claim 3, after the second insulation pattern and the first insulation pattern are formed, further comprising forming a third insulation layer and patterning the third insulation layer to form a third insulation pattern, wherein, the third insulation pattern, the first conductive pattern, the second insulation pattern and the first insulation pattern comprise: a third via hole running through the third insulation layer, the first conductive layer, the second insulation layer and the first insulation layer in a position corresponding to the first via hole and exposing the first end, and a fourth via hole running through the third insulation layer, the first conductive layer, and the second insulation layer in a position corresponding to the second via hole and exposing the second end.

10. The manufacturing method of the display substrate according to claim 9, after the third insulation pattern is formed, further comprising forming a second conductive pattern, wherein, the second conductive pattern comprises a first connection structure, the first connection structure connects the first end with the second end via the third via hole and the fourth via hole.

11. The manufacturing method of the display substrate according to claim 10, wherein, the first connection structure is connected with parts of the first conductive portion which are disconnected at a position corresponding to the third via hole and the fourth via hole, and the parts of the first conductive portion electrically connect with the first end and the second end through the first connection structure located at the third via hole and the fourth via hole.

12. The manufacturing method of the display substrate according to claim 10, wherein, the display substrate comprises a display area and a peripheral area located on at least one side of the display area, the first metal pattern, the second metal pattern, the first conductive pattern and the second conductive pattern are located in the peripheral area, the display area comprises a gate electrode, a drain electrode, a first electrode and a second electrode, the gate electrode is formed on a same layer as one of the first metal pattern and the second metal pattern, and the drain electrode is formed on a same layer as the other one of the first metal pattern and the second metal pattern, the first electrode and the first conductive pattern are formed on a same layer, and the second electrode and the second conductive pattern are formed on a same layer.

13. The manufacturing method of the display substrate according to claim 12, wherein the display area further comprises a second connection structure formed on a same layer as the second conductive pattern, the second connection structure electrically connects the drain electrode with the first electrode, so as to form a structure in which a pixel electrode is electrically connected with a drain electrode, the second electrode is a common electrode.

14. The manufacturing method of the display substrate according to claim 1, wherein, the display substrate comprises a display area and a peripheral area located on at least one side of the display area, the first metal pattern, the second metal pattern, and the first conductive pattern are located in the display area, the display area comprises a gate line and a data line, one of the first metal pattern and the second metal pattern is the gate line, the other one of the first metal pattern and the second metal pattern is the data line, an orthographic projection of the gate line on the base substrate and an orthographic projection of the data line on the base substrate have the overlapping part.

15. The manufacturing method of the display substrate according to claim 14, after the second insulation pattern is formed, further comprising forming a third insulation layer and patterning the third insulation layer to form a third insulation pattern, wherein, one of the first metal pattern and the second metal pattern further comprises a drain electrode, at least two of the first insulation layer, the second insulation layer and the third insulation layer comprise a fifth via hole at a position corresponding to the drain electrode and exposing the drain electrode.

16. The manufacturing method of the display substrate according to claim 15, after the third insulation pattern is formed, further comprising forming a second conductive pattern; wherein, the first conductive pattern comprises a common electrode, the second conductive pattern comprises a pixel electrode, the pixel electrode is electrically connected with the drain electrode via the fifth via hole.

17. The manufacturing method of the display substrate according to claim 15, after the third insulation pattern is formed, further comprising forming a second conductive pattern comprising a second connection structure and a common electrode; the first conductive pattern comprises a second covering portion and a second conductive portion; during patterning the second insulation layer, an orthographic projection of the second covering portion on the base substrate at least covers the overlapping part; the second connection structure electrically connects the drain electrode with the second conductive portion via the fifth via hole, so as to form a structure in which a pixel electrode is electrically connected with the drain electrode.

18. The manufacturing method of the display substrate according to claim 1, further comprising forming a fourth insulation pattern located on the second insulation layer, wherein a material of the fourth insulation pattern comprises resin.

19. A display substrate manufactured by the manufacturing method according to claim 1.

20. A display device comprising the display substrate according to claim 19.

* * * * *